(12) United States Patent
Venugopal

(10) Patent No.: US 8,254,430 B1
(45) Date of Patent: Aug. 28, 2012

(54) METHOD AND APPARATUS FOR DETECTION AND CONTROL OF SPREAD SPECTRUM EMI REDUCTION

(76) Inventor: Narendar Venugopal, San Jose, CA (US)

( * ) Notice: Subject to any disclaimer, the term of this patent is extended or adjusted under 35 U.S.C. 154(b) by 3848 days.

(21) Appl. No.: 09/950,225

(22) Filed: Sep. 10, 2001

(51) Int. Cl.
*H04B 1/00* (2006.01)
(52) U.S. Cl. ... 375/147; 318/606; 329/315; 340/870.18; 342/128; 375/130; 375/146; 375/376; 386/256
(58) Field of Classification Search .................. 375/146, 375/147, 135, 136, 295, 316, 130, 139, 376, 375/375; 345/3.2; 455/39, 296; 327/113, 327/159; 360/29
See application file for complete search history.

(56) References Cited

U.S. PATENT DOCUMENTS

| | | | | | |
|---|---|---|---|---|---|
| 3,810,098 | A | * | 5/1974 | Jamet et al. | 340/3.21 |
| 4,321,706 | A | * | 3/1982 | Craft | 375/295 |
| 5,631,920 | A | * | 5/1997 | Hardin | 375/130 |
| 5,708,476 | A | * | 1/1998 | Myhrvold et al. | 348/473 |
| 5,872,807 | A | * | 2/1999 | Booth et al. | 375/130 |
| 6,008,631 | A | * | 12/1999 | Johari | 323/266 |
| 6,167,103 | A | * | 12/2000 | Hardin | 375/376 |
| 6,501,307 | B1 | * | 12/2002 | Yen | 327/113 |
| 6,643,317 | B1 | * | 11/2003 | Blumer | 375/130 |
| 2002/0186435 | A1 | * | 12/2002 | Shpantzer et al. | 359/136 |
| 2003/0095366 | A1 | * | 5/2003 | Pellegrino | 361/93.1 |

* cited by examiner

*Primary Examiner* — David C. Payne
*Assistant Examiner* — Adolf DSouza
(74) *Attorney, Agent, or Firm* — Howard Cohen

(57) ABSTRACT

A method and apparatus for enabling the operative association of electronic devices that each employ spread spectrum EMI noise reduction. The method includes the detection of frequency modulation and the generation of a modulation detection signal that conveys the modulation extent and type. The modulation detection signal is then used to accommodate the modulation technique and make it compatible with the receiving electronic device. The apparatus of the invention includes an FM modulator that creates an FM signal from an input signal, an FM detector that detects the FM content of the incoming signal and represent this information by means of either voltage or current signals, and a circuit to process this FM information and perform functions such as modification of the FM content and generating a new signal with this new content, complete removal of the content, and "no-action," whereby the signal is passed on with no alteration to the content.

10 Claims, 2 Drawing Sheets

METHOD AND APPARATUS FOR DETECTION AND CONTROL OF SPREAD SPECTRUM EMI REDUCTION

BACKGROUND OF THE INVENTION

EMI (electromagnetic interference) is the generation of undesired radiated energy which has the potential for interfering with the operation of electronic systems. Regulatory bodies exist in most countries to set standards and guidelines for EMI, and these bodies also monitor emissions by industrial, commercial, and domestic systems to assure compliance. One method to assure compliance with regulatory requirements is to modulate a signal that is generating unacceptable EMI and tailor the energy power spectrum of the signal to distribute the radiated components and limit their amplitude. For example, EMI can be reduced by distributing the emitted energy of a clock source (periodic signal) over a wider frequency band by modulation techniques known in the prior art. This technique is also termed spread spectrum EMI reduction.

In the case of frequency modulation, the modulation profile describes the instantaneous frequency of the modulated signal at any instant. In more general terms, it gives an indication of how much the frequency deviates from its average value (bandwidth), how fast this deviation takes place (the rate of modulation), and in what manner (sinusoidal, triangular, parabolic) the variation occurs. All of these parameters have great influence on the EMI emissions of a system.

Due to the numerous modulation profiles which can be generated, and the varieties of physical configurations that may be used, it is extremely unlikely that two spread spectrum noise reduction systems can be interfaced without encountering problems related to the superposition of these modulating signals on one another.

However, systems that employ separate spread spectrum EMI reduction techniques are often combined into a single device. For example, in laptop (notebook) computers today, there are two distinct modules that re required to obtain EMI certification from the associated regulatory body (FCC, CISPER, etc). They are 1) The motherboard and
2) The LCD panel module.

Manufacturers of these devices (notebook computers and similar appliances) typically connect LCD panels from different panel manufacturers to motherboards from other sources. In order to achieve EMI compliance, a large number of notebook computer motherboard designers and manufacturers use Spread Spectrum clocking techniques. In particular, these techniques see wide application in the transfer of "graphics data" from the graphics controller on the motherboard, to the LCD panel, over a cabled connection or trace lines. This methodology has been in use for more than 5 years.

The display panel manufacturer must also meet EMI compliance guidelines set by the same regulatory bodies (FCC, CISPEWR etc) and are now exploring the use of these very same Spread Spectrum clocking techniques to control emissions from data on the panel. When these two modules (the motherboard and panel), each using their separate Spread Spectrum clocking techniques, are linked to each other to create the final product, a complete notebook computer, the spread spectrum clocking modulations from the motherboard will be injected into the panel module and the panel will superimpose its own spread spectrum modulation on top of the incoming signal. This will lead to "secondary modulation" effects and errors in the data transfer. This may result in "screen flickering or scrolling" and other subtler visual degradation, or other, more severe problems.

SUMMARY OF THE INVENTION

The present invention generally comprises a method and apparatus for enabling the operative association of two or more electronic devices that each employ spread spectrum EMI noise reduction. In general terms, the method of the invention includes the detection of frequency modulation indicative of a spread spectrum noise reduction system, and the generation of a modulation detection signal that conveys the modulation extent and type. The modulation detection signal is then used to accommodate the modulation technique and make it compatible with another electronic device. The method of accommodation may include (but is not restricted to):

1) To pass any modulation through;
2) To pass only a certain amount through;
3) To completely remove the incoming modulation and recreate a new one;
4) To add modulation if none is present in the original signal.

The apparatus of the invention consists of:

1) An FM modulator that performs the function of creating an FM signal from an input signal. This may be implemented in numerous fashions known in the prior art.
2) An FM detector that can detect the FM content of the incoming signal and represent this information by means of either voltage or current values.
3) A circuit to process this FM information and perform certain functions. based on it. These functions may include (but not limited to) modification of the FM content and generating a new signal with this new content, complete removal of the content, and "no-action," whereby the signal is passed on or regenerated with no alteration to the content.

The apparatus of the invention may be embodied in "smart" ICs that incorporate the capability of spread spectrum modulation detection and control. Both modules, the motherboard and panel, will use these "smart" ICs. Using the example above of a notebook computer having a motherboard and a display panel system, the existence of modulation from the motherboard will be sensed by the IC(s) on the display panel and then control signals will be generated form these ICs to accommodate this incoming modulation if present at all. The user of the ICs (or the vendor of the integrated system) can program these decisions and this will guarantee that both of these modules comply with EMI regulations individually and yet can still function correctly when used together.

DESCRIPTION OF THE PREFERRED EMBODIMENT

The present invention generally comprises a method and apparatus for enabling the operative association of two or more electronic devices that each employ spread spectrum EMI noise reduction.

Figure 3:
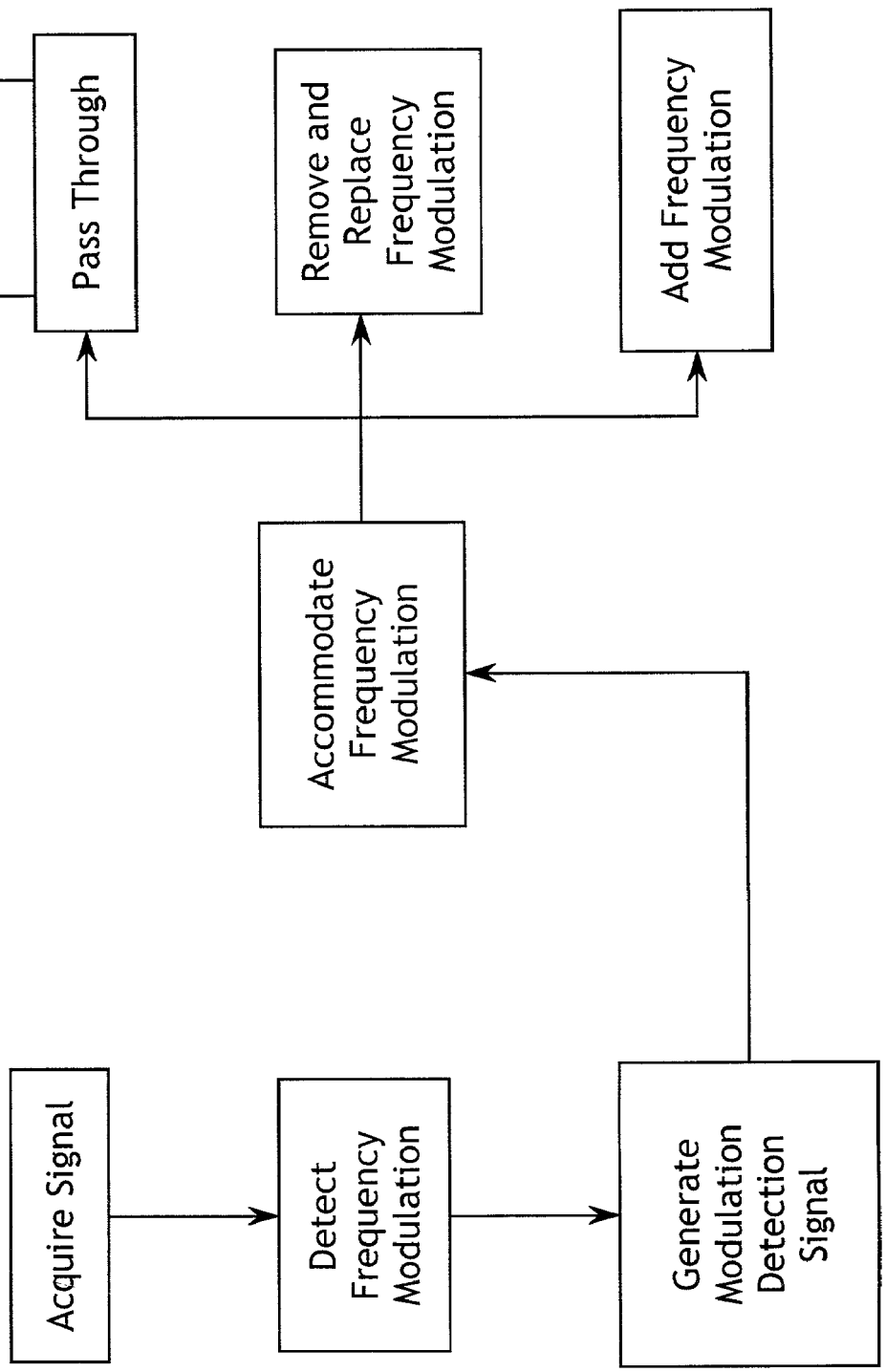
FIG. 3 is a functional block diagram of the method of the present invention for detecting and controlling spread spectrum EMI reduction signals.

With regard to FIG. 3, the method of the invention includes the initial step of acquiring a signal, such as a clock signal, bus signal, or other communications from a digital appliance of any general function or configuration. The next step is to detect the frequency modulation of the acquired signal, if there be any frequency modulation, and then to generate a modulation detection signal. The modulation detection signal is configured to communicate the modulation extent and type. For example, the modulation detection signal may comprise a voltage varying in time with the frequency of the acquired signal, thereby to reveal such parameters as modulation envelope, modulation rate, bandwidth, and the like.

The modulation detection signal is then used to accommodate the frequency modulation of the acquired signal to the system that has acquired the signal. Accommodation may take any one of several forms, such as: to pass through all or some of the modulation of the acquired signal; to remove the modulation of the incoming signal and replace it with a new modulation configuration that is compatible with the acquiring system; or to add modulation, when none is present, that is compatible with the acquiring system. The choice of mitigating steps is formulated based on the compatibility of the modulation detection signal with the frequency modulation scheme of the acquiring system, if one is operating in the acquiring system.

Figure 2:
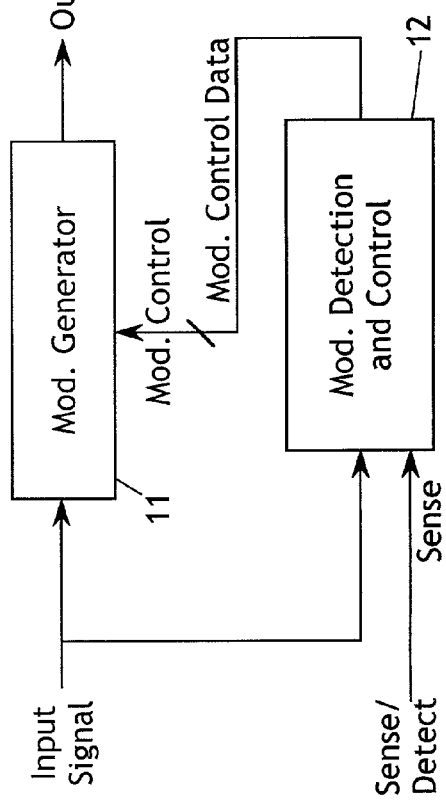
FIG. 2 is a functional block diagram of the general architecture of a system for detecting and controlling spread spectrum EMI reduction signals.

With regard to FIG. 2, the general architecture of a spread spectrum modulation sensing and control system includes a modulation generator 11 which receives an input signal (the aforementioned acquired signal) and applies one or more modulation processes to the input signal. These processes may include, but are not limited to, DDS, Fractional N, Feedback Modulation, and the like. The input signal is also fed to a modulation detection and control system 12, which also receives a sense/detect signal. The system 12 performs such functions as frequency to voltage conversion, peak detection, slope detection, and the like to derive functional parameters of the frequency modulation of the input signal.

The output of modulation detection and control system 12 may comprise a voltage signal or digital signal that is fed to the modulation generator 11 to effect control of the modulation created by the generator 11. The output signal of the generator 11 thus may comprise a frequency modulated signal that is compatible with the system that has received the input signal. For example, if the sense/detect signal is related to the modulation envelope of a signal of the acquiring system (such as its clock signal), the modulation control data signal may be constructed to achieve any of the accommodating steps shown in FIG. 3: passing through some or all of the modulation characteristics of the input signal; removing and replacing the frequency modulation of the input signal, or adding frequency modulation to the input signal if the input signal is found to have no modulation originally.

Figure 1:
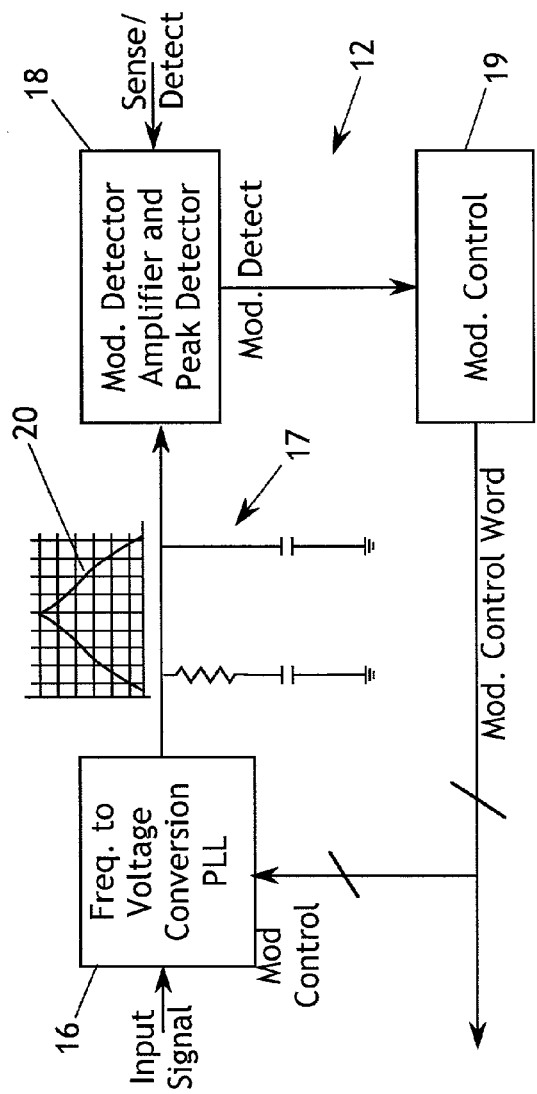
FIG. 1 is a function block diagram of a modulation detection and control apparatus in accordance with the present invention.

With regard to FIG. 1, one embodiment of the modulation detection and control circuit 12 includes a frequency to voltage conversion PLL 16 that receives the acquired input signal and generates an output that is fed to a parallel RC network 17. The voltage across the network 17 is represented by the trace 20, which describes the modulation envelope of the acquired signal, and indicates modulation shape, slope, peak, period, bandwidth, and other parameters. The signal 20 shown describes a generally triangular modulation profile, although many other profiles are possible. The signal 20 is fed to a modulation detector amplifier and peak detector 18, which also receives the sense/detect signal, as shown also in FIG. 2. Assuming that the sense/detect signal is related to the modulation profile of the clock signal of the system that is acquiring the input signal, the output of the detector 18 may comprise a mod. detect signal that expresses the differences in modulation characteristics of the acquired signal and the clock signal of the acquiring system. The mod. detect signal is fed to a modulation control circuit 19, which generates a modulation control word using any of several known techniques, such as DAC, a ROM lookup table, or the like. The modulation control word is fed to the PLL 16 as a control signal, and also to the modulation generator 11 shown in FIG. 2.

In the example given above, in which a computer motherboard is linked to a display module, each may include a "smart" IC that incorporates the circuitry of FIGS. 1 and 2 to carry out the method of FIG. 3. Each device will sense the spread spectrum frequency modulation characteristics of the clock signal of the other device (the acquired signal), and will accommodate the detected frequency modulation using one of the methods listed above: 1) To pass any modulation through; 2) To pass only a certain amount through; 3) To completely remove the incoming modulation and recreate a new one; 4) Add modulation if none is present in the original acquired signal. The smart ICs may be programmed to choose and execute these methods based on the modulation parameters of the acquired signal, whereby the motherboard and display module may be operatively interact without suffering secondary modulation effects and the like. Thus the motherboard and the display module may be certified independently as units that comply with EMI emission regulations, and yet may function correctly when used together in a computer or other electronic appliance.

It should be noted that there is a wide range of electronic devices that employ frequency modulation spread spectrum techniques for EMI suppression, and any of these may benefit from the methodology and devices disclosed herein. Likewise, although clock signals are mentioned herein as frequency modulated system signals, any digital signal employed in an electronic device may be used as an input for the method and apparatus of this invention.

The foregoing description of the preferred embodiment of the invention has been presented for purposes of illustration and description. It is not intended to be exhaustive or to limit the invention to the precise form disclosed, and many modifications and variations are possible in light of the above teaching without deviating from the spirit and the scope of the invention. The embodiment described is selected to best explain the principles of the invention and its practical application to thereby enable others skilled in the art to best utilize the invention in various embodiments and with various modifications as suited to the particular purpose contemplated. It is intended that the scope of the invention be defined by the claims appended hereto.

The invention claimed is:

1. A method for operatively connecting a first independent electronic device employing a first periodic signal having a frequency that is modified with a first spread spectrum frequency modulation, with a second independent electronic device having a second periodic signal having an unknown second spread spectrum frequency modulation, including the steps of:

said first electronic device acquiring said second periodic signal and detecting the unknown spread spectrum frequency modulation of said second periodic signal;

said first electronic device accommodating the spread spectrum frequency modulation of said second periodic signal to be compatible with said first spread spectrum frequency modulation of said first periodic signal;

wherein said accommodating step includes passing at least some of the spread spectrum frequency modulation of said second periodic signal through to said first independent electronic device.

2. A method for operatively connecting a first independent electronic device employing a first periodic signal having a frequency that is modified with a first spread spectrum frequency modulation, with a second independent electronic device having a second periodic signal having an unknown second spread spectrum frequency modulation, including the steps of:
   said first electronic device acquiring said second periodic signal and detecting the unknown spread spectrum frequency modulation of said second periodic signal;
   said first electronic device accommodating the spread spectrum frequency modulation of said second periodic signal to be compatible with said first spread spectrum frequency modulation of said first periodic signal;
   wherein said accommodating step includes removing substantially all of said spread spectrum frequency modulation of said second periodic signal.

3. A method for operatively connecting a first independent electronic device employing a first periodic signal having a frequency that is modified with a first spread spectrum frequency modulation, with a second independent electronic device having a second periodic signal having an unknown second spread spectrum frequency modulation, including the steps of:
   said first electronic device acquiring said second periodic signal and detecting the unknown spread spectrum frequency modulation of said second periodic signal;
   said first electronic device accommodating the spread spectrum frequency modulation of said second periodic signal to be compatible with said first spread spectrum frequency modulation of said first periodic signal;
   wherein said accommodating step includes adding new spread spectrum frequency modulation to said second periodic signal.

4. A method for operatively connecting a first independent electronic device employing a first periodic signal having a frequency that is modified with a first spread spectrum frequency modulation, with a second independent electronic device having a second periodic signal having an unknown second spread spectrum frequency modulation, including the steps of:
   said first electronic device acquiring said second periodic signal and detecting the unknown spread spectrum frequency modulation of said second periodic signal;
   said first electronic device accommodating the spread spectrum frequency modulation of said second periodic signal to be compatible with said first spread spectrum frequency modulation of said first periodic signal;
   wherein said accommodating step includes adding spread spectrum frequency modulation to said second periodic signal if no spread spectrum frequency modulation thereof is detected.

5. A method for operatively connecting a first independent electronic device employing a first periodic signal having a frequency that is modified with a first spread spectrum frequency modulation, with a second independent electronic device having a second periodic signal having an unknown second spread spectrum frequency modulation, including the steps of:
   said first electronic device acquiring said second periodic signal and detecting the unknown spread spectrum frequency modulation of said second periodic signal;
   said first electronic device accommodating the spread spectrum frequency modulation of said second periodic signal to be compatible with said first spread spectrum frequency modulation of said first periodic signal;
   further including the step of generating a modulation detection signal describing the unknown spread spectrum modulation characteristics of said second periodic signal.

6. A method for operatively connecting a first independent electronic device employing a first periodic signal having a frequency that is modified with a first spread spectrum frequency modulation, with a second independent electronic device having a second periodic signal having an unknown second spread spectrum frequency modulation, including the steps of:
   said first electronic device acquiring said second periodic signal and detecting the unknown spread spectrum frequency modulation of said second periodic signal;
   said first electronic device accommodating the spread spectrum frequency modulation of said second periodic signal to be compatible with said first spread spectrum frequency modulation of said first periodic signal;
   wherein said detecting step includes frequency to voltage conversion to develop an electronic signal indicative of said unknown spread spectrum frequency modulation of said second periodic signal.

7. The method of claim 6, further including the step of processing said electronic signal to generate a modulation control signal.

8. The method of claim 7, further including the step of feeding said second periodic signal to a modulation generator, and controlling said modulation generator with said modulation control signal, whereby said second periodic signal is modulated to be compatible with the spread spectrum frequency modulation of said first periodic signal.

9. The method of claim 7, wherein said step of processing said electronic signal includes detecting said electronic signal with respect to the spread spectrum frequency modulation of said first periodic signal.

10. An apparatus for operatively connecting a first independent electronic device employing a first periodic signal having a frequency that is modified with a first spread spectrum frequency modulation, with a second independent electronic device employing a second periodic signal having an unknown second spread spectrum frequency modulation, including:
    modulation detection and control means for receiving said second periodic signal and determining the second spread spectrum frequency modulation of said second periodic signal and generating a control signal related to said second spread spectrum frequency modulation;
    modulation generator means for receiving said second spread spectrum periodic signal and outputting a modulated output signal, said control signal being applied to said modulation generator means for control thereof to configure said modulated output signal to be compatible with said first spread spectrum frequency modulation of said first periodic signal;
    wherein said modulation detector and control means includes means for frequency to voltage conversion of said second spread spectrum periodic signal to generate an electronic signal indicative of said second spread spectrum periodic signal.

* * * * *